(12) United States Patent
Jansen et al.

(10) Patent No.: US 7,403,261 B2
(45) Date of Patent: Jul. 22, 2008

(54) LITHOGRAPHIC APPARATUS AND DEVICE MANUFACTURING METHOD

(75) Inventors: Hans Jansen, Eindhoven (NL); Patricius Aloysius Jacobus Tinnemans, Hapert (NL); Jan-Gerard Cornelis Van Der Toorn, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 123 days.

(21) Appl. No.: 11/012,061

(22) Filed: Dec. 15, 2004

(65) Prior Publication Data

US 2006/0126037 A1    Jun. 15, 2006

(51) Int. Cl.
G03B 27/52 (2006.01)
G03B 27/42 (2006.01)

(52) U.S. Cl. .......................... 355/30; 355/53
(58) Field of Classification Search ............... 355/53, 355/30, 72, 75; 378/34; 250/548, 492.2; 359/380
See application file for complete search history.

(56) References Cited

U.S. PATENT DOCUMENTS

| | | | | |
|---|---|---|---|---|
| 3,573,975 A | 4/1971 | Dhaka et al. | ................ | 117/212 |
| 3,648,587 A | 3/1972 | Stevens | ..................... | 95/44 |
| 4,346,164 A | 8/1982 | Tabarelli et al. | ............ | 430/311 |
| 4,390,273 A | 6/1983 | Loebach et al. | ............. | 355/125 |
| 4,396,705 A | 8/1983 | Akeyama et al. | ........... | 430/326 |
| 4,480,910 A | 11/1984 | Takanashi et al. | ............ | 355/30 |
| 4,509,852 A | 4/1985 | Tabarelli et al. | .............. | 355/30 |
| 5,040,020 A | 8/1991 | Rauschenbach et al. | ....... | 355/53 |
| 5,121,256 A | 6/1992 | Corle et al. | ................. | 359/664 |
| 5,610,683 A | 3/1997 | Takahashi | ..................... | 355/53 |
| 5,825,043 A | 10/1998 | Suwa | .......................... | 250/548 |
| 5,900,354 A | 5/1999 | Batchelder | ................... | 430/395 |
| 6,236,634 B1 | 5/2001 | Lee et al. | ..................... | 369/112 |
| 6,400,445 B2 * | 6/2002 | Nishi et al. | .................. | 355/72 |
| 6,191,429 B1 | 2/2003 | Suwa et al. | | |
| 6,600,547 B2 | 7/2003 | Watson et al. | ................. | 355/30 |
| 6,603,130 B1 | 8/2003 | Bisschops et al. | ......... | 250/492.1 |
| 2002/0020821 A1 | 2/2002 | Van Santen et al. | ......... | 250/492 |
| 2002/0163629 A1 | 11/2002 | Switkes et al. | ................ | 355/53 |
| 2003/0098964 A1 * | 5/2003 | Lee et al. | ...................... | 355/73 |

(Continued)

FOREIGN PATENT DOCUMENTS

DE    206 607    2/1984

(Continued)

OTHER PUBLICATIONS

M. Switkes et al., "Immersion Lithography at 157 nm", MIT Lincoln Lab, Orlando 2001-1, Dec. 17, 2001.

(Continued)

*Primary Examiner*—Peter B Kim
(74) *Attorney, Agent, or Firm*—Pillsbury Winthrop Shaw Pittman LLP

(57) ABSTRACT

The present invention relates to the method of reducing contamination of an immersion liquid in a lithographic apparatus when a closing surface is used to confine liquid in a liquid supply system. To avoid or reduce particulate contamination caused by the closing surface colliding with the liquid supply system, the closing surface is maintained at a distance away from the liquid supply system such that there is no collision between the closing surface and the liquid supply system, but the liquid is nonetheless confined.

20 Claims, 4 Drawing Sheets

U.S. PATENT DOCUMENTS

| | | | |
|---|---|---|---|
| 2003/0123040 A1 | 7/2003 | Almogy | 355/69 |
| 2004/0000627 A1 | 1/2004 | Schuster | 250/201.2 |
| 2004/0075895 A1 | 4/2004 | Lin | 359/380 |
| 2004/0114117 A1 | 6/2004 | Bleeker | 355/53 |
| 2004/0136494 A1 | 7/2004 | Lof et al. | 378/34 |
| 2004/0160582 A1 | 8/2004 | Lof et al. | 355/30 |
| 2004/0165159 A1 | 8/2004 | Lof et al. | 355/30 |
| 2004/0207824 A1 | 10/2004 | Lof et al. | 355/30 |
| 2004/0211920 A1 | 10/2004 | Derksen et al. | 250/492.1 |
| 2004/0239954 A1 | 12/2004 | Bischoff | 356/635 |
| 2004/0263809 A1* | 12/2004 | Nakano | 355/30 |
| 2005/0007569 A1 | 1/2005 | Streefkerk et al. | 355/30 |
| 2005/0018155 A1 | 1/2005 | Cox et al. | 355/30 |
| 2005/0024609 A1 | 2/2005 | De Smit et al. | 355/18 |
| 2005/0030497 A1 | 2/2005 | Nakamura | 355/30 |
| 2005/0046813 A1 | 3/2005 | Streefkerk et al. | 355/30 |
| 2005/0046934 A1 | 3/2005 | Ho et al. | 359/380 |
| 2005/0052632 A1 | 3/2005 | Miyajima | 355/53 |
| 2005/0094116 A1 | 5/2005 | Flagello et al. | 355/53 |
| 2005/0094125 A1 | 5/2005 | Arai | 355/72 |
| 2005/0122505 A1 | 6/2005 | Miyajima | 355/72 |
| 2005/0132914 A1 | 6/2005 | Mulkens et al. | 101/463.1 |
| 2005/0134817 A1 | 6/2005 | Nakamura | 355/53 |
| 2005/0140948 A1 | 6/2005 | Tokita | 355/30 |
| 2005/0146693 A1 | 7/2005 | Ohsaki | 355/30 |
| 2005/0146694 A1 | 7/2005 | Tokita | 355/30 |
| 2005/0151942 A1 | 7/2005 | Kawashima | 355/30 |
| 2005/0200815 A1 | 9/2005 | Akamatsu | 353/53 |
| 2005/0213065 A1 | 9/2005 | Kitaoka | 355/53 |
| 2005/0213066 A1 | 9/2005 | Sumiyoshi | 355/53 |
| 2005/0219489 A1 | 10/2005 | Nei et al. | 355/53 |
| 2005/0233081 A1 | 10/2005 | Tokita | 427/256 |
| 2006/0033894 A1* | 2/2006 | Binnard | 355/30 |

FOREIGN PATENT DOCUMENTS

| | | |
|---|---|---|
| DE | 221 563 | 4/1985 |
| DE | 224 448 | 7/1985 |
| DE | 242 880 | 2/1987 |
| EP | 0023231 | 2/1981 |
| EP | 0418427 | 3/1991 |
| EP | 1039511 | 9/2000 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| WO | WO 99/49504 | 9/1999 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/07589 A1 | 7/2004 |
| WO | WO 2004/055803 A1 | 7/2004 |
| WO | WO 2004/057590 A1 | 7/2004 |
| WO | WO 2004/090577 | 10/2004 |
| WO | WO 2004/090633 | 10/2004 |
| WO | WO 2004/090634 | 10/2004 |
| WO | WO 2004/092830 | 10/2004 |
| WO | WO 2004/092833 | 10/2004 |
| WO | WO 2004/093130 | 10/2004 |
| WO | WO 2004/093159 | 10/2004 |
| WO | WO 2004/093160 | 10/2004 |
| WO | WO 2004/095135 | 11/2004 |
| WO | WO 2005/010611 | 2/2005 |
| WO | WO 2005/024517 | 3/2005 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths To Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immerison Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future FAB International, vol. 15, Jul. 11, 2003.

H. Kawata et al., "Fabrication of 0.2µm Fine Patterns Using Optical Projection Lithography with an Oil Immersion Lens", Jpn. J. Appl. Phys. vol. 31 (1992), pp. 4174-4177.

G. Owen et al., "1/8µm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International SEMATECH, Los Angeles, Jan. 27-29, 2004, Slide Nos. 1-51.

H. Hata, "The Development of Immersion Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $k_3$ coefficient in nonparaxial λ/NA scaling equations for resolution, depth of focus, and immersion lithography, *J. Microlith., Microfab., Microsyst.* 1(1):7-12 (2002).

\* cited by examiner

Fig. 2
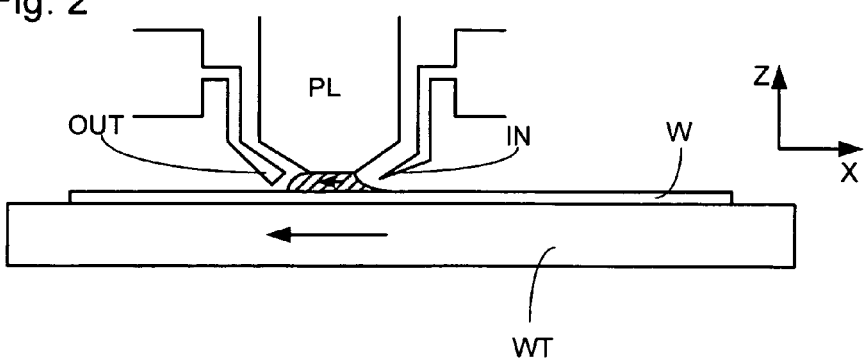
Fig. 3
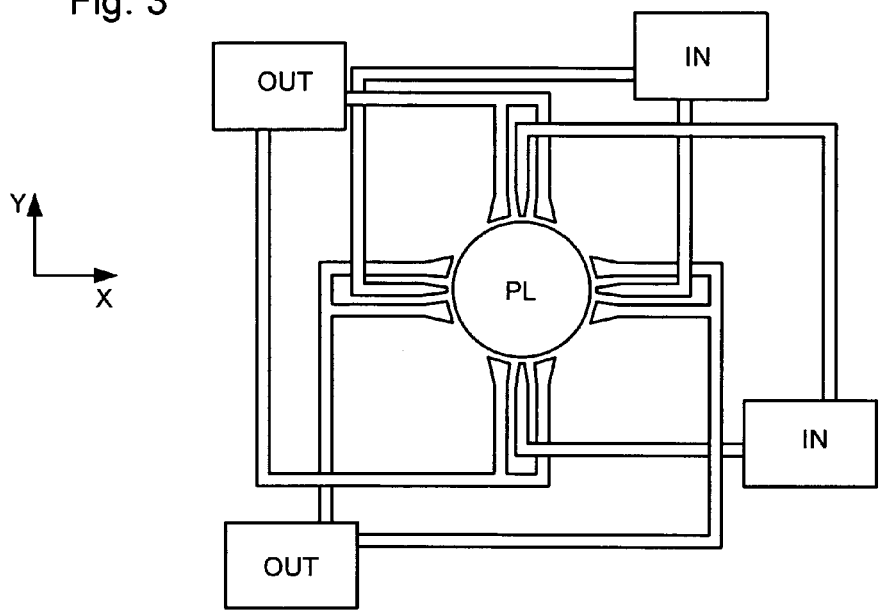
Fig. 4
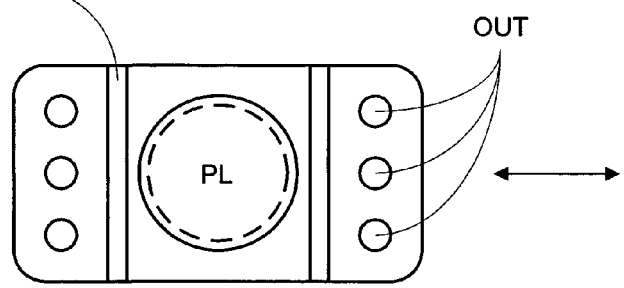
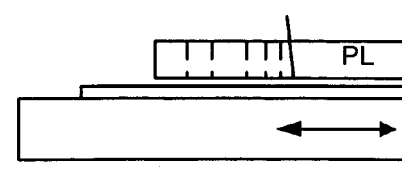

LITHOGRAPHIC APPARATUS AND DEVICE MANUFACTURING METHOD

FIELD

The present invention relates to a lithographic apparatus and a device manufacturing method, in particular an immersion lithographic apparatus which contains a liquid between a projection system and a substrate to be exposed and a related immersion device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate (the substrate generally has a larger surface area than the final element of the projection system). One way which has been proposed to arrange for this is disclosed in PCT patent application WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

SUMMARY

Between exposures of substrates, a substrate finished being exposed is swapped with a substrate to be exposed. In order to do this in an immersion lithographic apparatus, a substrate positioned below the liquid supply system and the immersion liquid may be replaced by a closing surface. The closing surface enables, for example, a substrate to be swapped with another substrate without having to remove the liquid adjacent the substrate. The closing surface may allow the liquid flow within the liquid supply system to be maintained uninterrupted and to keep the surface of a final optical element of the projection system continuously wet. While the closing surface may be used for swapping one substrate for another, it may also be used in other applications such as maintenance on the substrate table, measurements of the substrate without liquid, etc. where it is desired to separate the liquid from the substrate and/or substrate table.

In an embodiment, the closing surface may be coupled with the liquid supply system using a vacuum on the bottom surface of a liquid confinement structure of the liquid supply system. A potential problem with this and other methods which may be used to couple the closing surface, such as mechanical methods, is that when the closing surface impacts the liquid supply system, particles may be dislodged from either the closing surface or the liquid supply system and enter the liquid. These particles may contaminate the liquid supply system and the liquid, and may contaminate the final optical element of the projection system and/or the substrate and/or they may partially block the light to cause printing defects. Contamination on the final optical element, on the substrate and/or in the liquid, where it may get in the path of the exposing projection beam, may reduce the accuracy of the exposure of the substrate. Furthermore, deposition of contaminants on the substrate may cause problems in other processing steps following the exposure process, such as etching, deposition, etc.

Accordingly, it would be advantageous, for example, to have a closing surface positioning system which may reduce the risk of contamination of the immersion liquid and any or all of the surfaces adjacent or contacting the liquid.

According to an aspect of the present invention, there is provided a lithographic apparatus, comprising:

a projection system configured to project a patterned radiation beam onto a substrate supported by a substrate table;

a liquid supply system configured to supply a space between the projection system and the substrate with a liquid;

a closing surface configured to provide a confining surface for liquid supplied by the liquid supply system in place of the substrate; and a closing surface positioning device configured to create and maintain a gap between the liquid supply system and the closing surface when the closing surface is used to confine the liquid supplied by the liquid supply system.

According to an aspect of the invention, there is provided a device manufacturing method, comprising:

supplying a liquid to a space between a projection system of a lithographic projection apparatus and a substrate using a liquid supply system;

creating and maintaining a gap between the liquid supply system and a closing surface when the closing surface confines the liquid supplied by the liquid supply system in place of a substrate; and projecting a patterned beam of radiation through the liquid onto the substrate when the substrate is used as a confining surface for the liquid supplied by the liquid supply system.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 2 and 3 depict a liquid supply system for use in a lithographic projection apparatus;

FIG. 4 depicts another liquid supply system for use in a lithographic projection apparatus;

DETAILED DESCRIPTION

Figure 1:
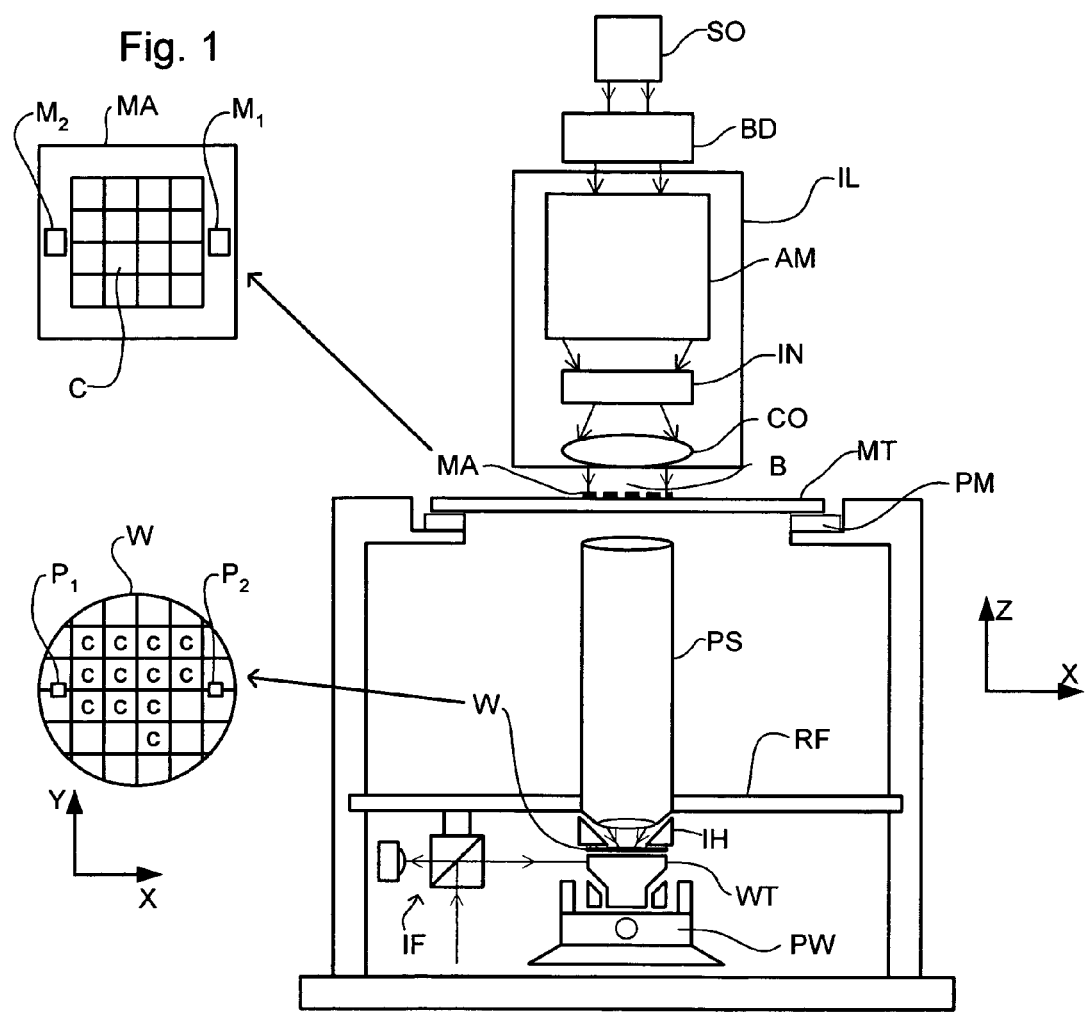
FIG. 1 depicts a lithographic apparatus according to an embodiment of the invention.

FIG. 1 schematically depicts a lithographic apparatus according to one embodiment of the invention. The apparatus comprises:

an illumination system (illuminator) EL configured to condition a radiation beam B (e.g. UV radiation or DUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Mask MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Figure 5:
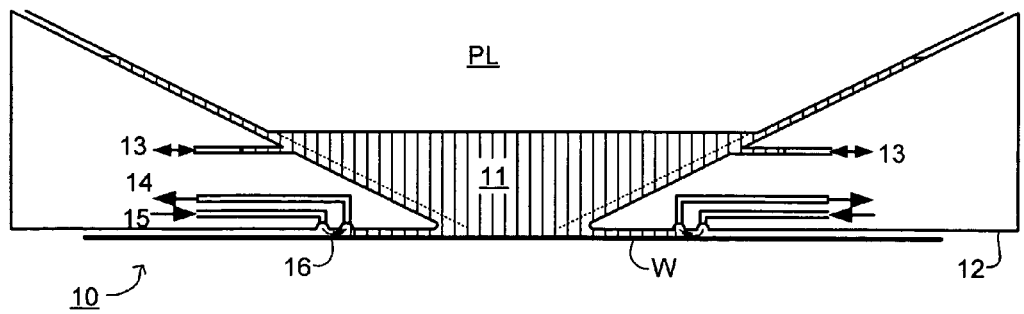
FIG. 5 depicts a further liquid supply system for use in a lithographic projection apparatus.

Another immersion lithography solution with a localized liquid supply system solution which has been proposed is to provide the liquid supply system with a liquid confinement structure which extends along at least a part of a boundary of the space between the final element of the projection system and the substrate table. Such a system is shown in FIG. 5. The liquid confinement structure is substantially stationary relative to the projection system in the XY plane though there may be some relative movement in the Z direction (in the direction of the optical axis). A seal is formed between the liquid confinement structure and the surface of the substrate. In an embodiment, the seal is a contactless seal such as a gas seal. Such a system with a gas seal is disclosed in U.S. patent application Ser. No. 10/705,783, hereby incorporated in its entirety by reference.

FIG. 5 depicts an arrangement of a reservoir 10, which forms a contactless seal to the substrate around the image field of the projection system so that liquid is confined to fill a space between the substrate surface and the final element of the projection system. A liquid confinement structure 12 positioned below and surrounding the final element of the projection system PL forms the reservoir. Liquid is brought into the space below the projection system and within the liquid confinement structure 12. The liquid confinement structure 12 extends a little above the final element of the projection system and the liquid level rises above the final element so that a buffer of liquid is provided. The liquid confinement structure 12 has an inner periphery that at the upper end preferably closely conforms to the shape of the projection system or the final element thereof and may, e.g., be round. At the bottom, the inner periphery closely conforms to the shape of the image field, e.g., rectangular though this need not be the case.

The liquid is confined in the reservoir by a gas seal 16 between the bottom of the liquid confinement structure 12 and the surface of the substrate W. The gas seal is formed by gas, e.g. air, synthetic air, $N_2$ or an inert gas, provided under pressure via inlet 15 to the gap between liquid confinement structure 12 and substrate and extracted via outlet 14. The overpressure on the gas inlet 15, vacuum level on the outlet 14 and geometry of the gap are arranged so that there is a high-velocity gas flow inwards that confines the liquid. It will be understood by the person skilled in the art that other types of seal could be used to contain the liquid such as simply an outlet to remove liquid and/or gas.

The gas seal may also be used to create a gap between the liquid supply system and either the closing surface or the substrate table.

Figure 6:
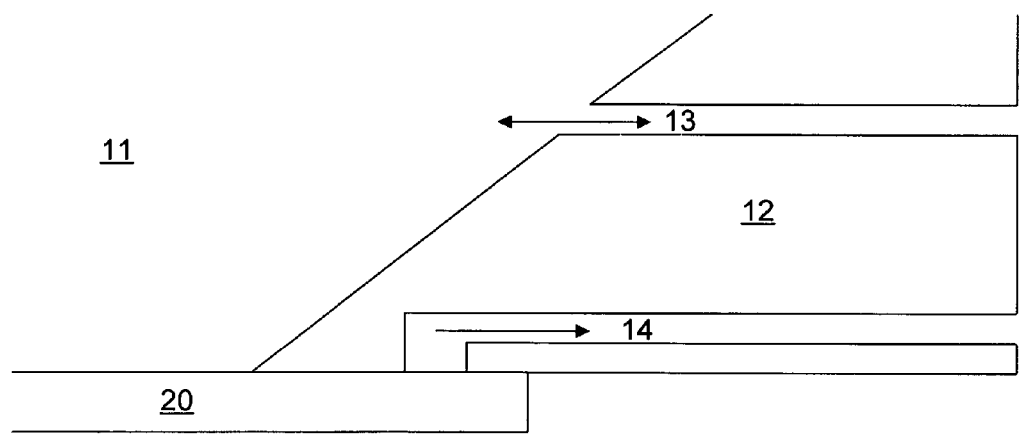
FIG. 6 depicts a liquid confinement structure of a liquid supply system with a closing plate.

FIG. 5 shows a liquid confinement structure 12 of a liquid supply system with a substrate W positioned below the immersion liquid 11. When, for example, this substrate is to be swapped with another substrate to be exposed next, the substrate W is replaced by a closing plate 20 as shown in FIG. 6. The closing plate 20 need not have a plate-like shape but only needs to provide a surface that can confine liquid. Thus, closing plate 20 can also be referred to as a closing structure or a closing surface.

FIG. 6 shows an orientation of the liquid confinement structure 12 and closing plate 20. A low pressure provided through outlet 14 as shown in FIGS. 5 and 6 is used to urge the closing plate 20 against the liquid confinement structure 12. When the closing plate 20 is urged against the liquid confinement structure 12 by outlet 14, particulate contamination of the immersion liquid 11 may occur because of particles being released from the surface of the closing plate 20 and/or the liquid confinement structure 12, predominantly initiated by their physical contact. Although there is an amount of liquid flow 13, it does not circulate the liquid 11 close to the surface of the closing plate 20 and particles are unlikely to be washed away as long as the closing plate is in position.

Figure 7:
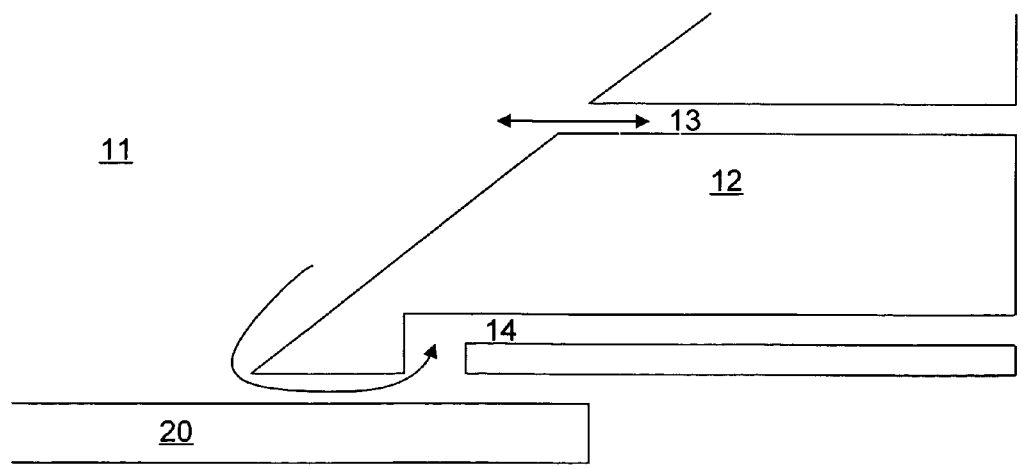
FIG. 7 depicts the liquid confinement structure of the liquid supply system depicted in FIG. 2 with the closing plate positioned according to an embodiment of the present invention.

FIG. 7 shows the closing plate 20 being maintained at a distance from the liquid confinement structure 12. In this way, there are at least two advantages—the first is that particles are unlikely to be released from the surfaces of the closing plate 20 and/or the liquid confinement structure 12 and the second is that any particles which are released and present in the immersion liquid 11 may be removed by the circulation of the liquid, particularly via outlet 14.

There are closing plate positioning devices by which the closing plate may be held a distance away from the liquid supply system (e.g., the liquid confinement structure). A first such device is the outlet 14 and the inlet 15 of the liquid confinement structure which may be used to maintain an equilibrium state between the low pressure of outlet 14 and the gas flow provided through inlet 15 as shown in FIG. 5. This equilibrium may be used not only to contain the immersion liquid 11, but also to cause the closing plate to "float" just below the liquid confinement structure.

Figure 8:
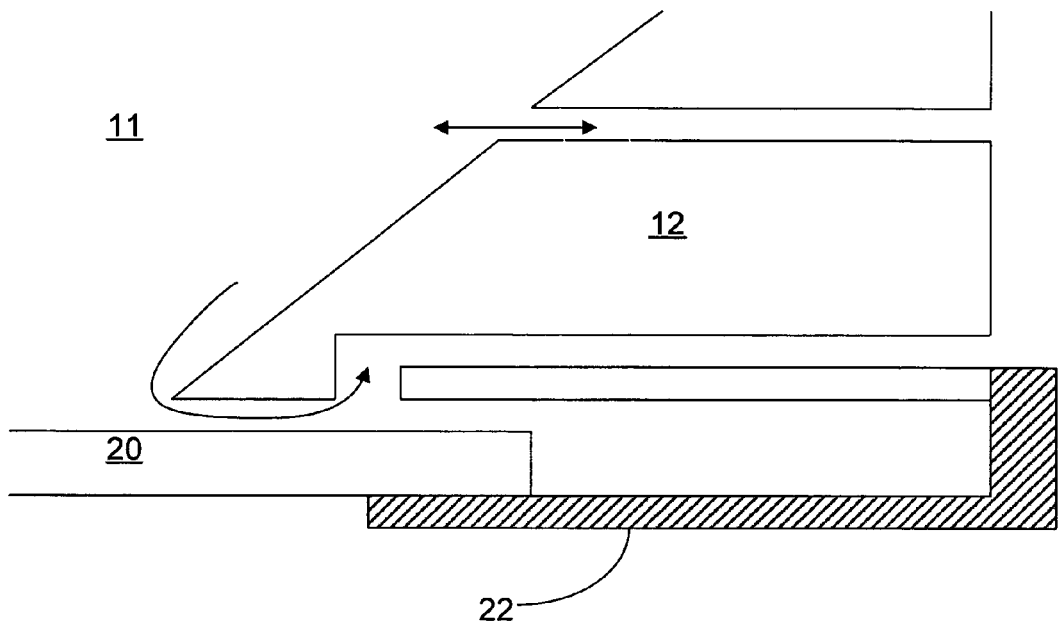
FIG. 8 depicts the liquid confinement structure and closing plate orientation of FIG. 7 according to an embodiment of the present invention.

FIG. 8 shows the closing plate 20 being maintained a distance away from the liquid confinement structure 12 by the use of a gripper 22. The gripper may be any mechanical device that maintains the position of the closing plate 12 for the desired duration (e.g., of the substrate swap). In FIG. 8, the gripper 22 is connected at one end to the closing plate 20 and at the other end to the liquid confinement structure 12. The other end of the gripper 22 may connected to other structures than the liquid confinement structure 12, such as the substrate table WT or a frame of the lithographic apparatus. An alternative may be a pin system comprising one or more pins that push the closing plate 20 away from its resting position on a substrate table WT for example, or any other mechanical device.

Figure 9:
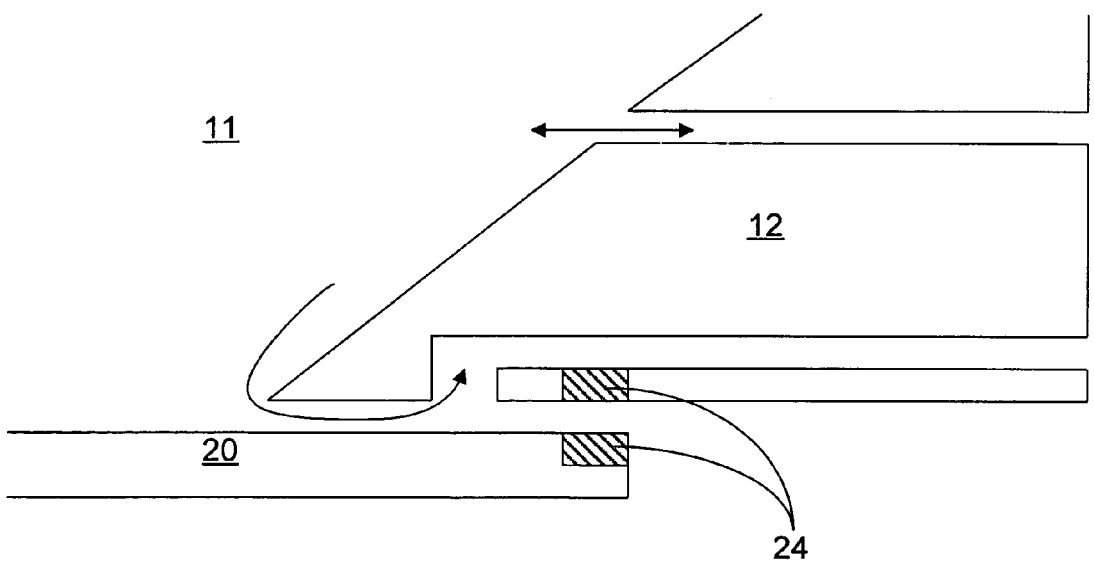
FIG. 9 depicts the liquid confinement structure and closing plate orientation of FIG. 7 according to another embodiment of the present invention.

FIG. 9 shows an alternative embodiment of the present invention. In particular, the closing plate 20 is maintained a distance away from the liquid confinement structure 12 by use of magnets 24. The magnets may be used in conjunction with the low pressure/gas flow equilibrium described above, or they may be balanced against one or more other magnets. For example, magnets with opposing poles may be balanced against magnets with the same poles facing each other to cause the closing plate 20 to "float". In an embodiment, a magnet may be provided on each of the liquid supply system and the substrate table to facilitate maintaining the closing plate 20 a distance away from the liquid confinement structure 12. It will be appreciated that other similar methods of holding the closing plate 20 a distance away from the liquid supply system, such as electrostatics, etc.

In European Patent Application No. 03257072.3, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the present invention may be applied to any immersion lithography apparatus, such as those types mentioned above, and whether the immersion liquid is provided in the form of a bath or only on a localized surface area of the substrate. A liquid supply system is any mechanism that provides a liquid to a space between the projection system and the substrate and/or substrate table. It may comprise any combination of one or more structures, one or more liquid inlets, one or more gas inlets, one or more gas outlets, and/or one or more liquid outlets, the combination providing and confining the liquid to the space. In an embodiment, a surface of the space may be limited to a portion of the substrate and/or substrate table, a surface of the space may completely cover a surface of the substrate and/or substrate table, or the space may envelop the substrate and/or substrate table.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus, comprising:
a projection system configured to project a patterned radiation beam onto a substrate supported by a substrate table;
a liquid supply system configured to supply a space between the projection system and the substrate with a liquid;
a closing surface configured to provide a confining surface for liquid supplied by the liquid supply system in place of the substrate; and
a closing surface positioning device configured to create and maintain a gap between the liquid supply system and the closing surface when the closing surface is used to confine the liquid supplied by the liquid supply system,
wherein, in use at a point in time, (i) no portion of the closing surface comes in contact with the liquid supply system, (ii) the closing surface is held only by the liquid supply system, and (iii) liquid flows within the gap.

2. The apparatus according to claim 1, wherein the closing surface positioning device comprises an inlet and outlet configured to create an equilibrium state between forces exerted by a fluid supplied by the inlet and a low pressure provided by the outlet.

3. The apparatus according to claim 1, wherein the closing surface is formed on a closing plate, and wherein the closing surface positioning device comprises a gripper configured to grip the closing plate on a face facing other than towards the liquid in the liquid supply system.

4. The apparatus according to claim 3, wherein gripper is attached to the liquid supply system.

5. The apparatus according to claim 1, wherein the closing surface positioning device comprises a pin system configured to displace the closing surface from the substrate table.

6. The apparatus according to claim 1, wherein the closing surface positioning device comprises a magnet on each of the liquid supply system and the closing surface.

7. The apparatus according to claim 6, wherein a magnet on each of the liquid supply system and the closing surface having opposing poles is balanced against a magnet on each of the liquid supply system and the closing surface having the same poles.

8. The apparatus according to claim 1, wherein the closing surface positioning device comprises a magnet on each of the liquid supply system and the substrate table.

9. The apparatus according to claim 1, wherein the liquid that flows within the gap circulates.

10. The apparatus according to claim 1, wherein the liquid that flows within the gap flows to an outlet.

11. A device manufacturing method, comprising:
supplying a liquid to a space between a projection system of a lithographic projection apparatus and a substrate supported by a substrate table using a liquid supply system;
creating and maintaining a gap between the liquid supply system and a closing surface when the closing surface confines the liquid supplied by the liquid supply system in place of a substrate; and
projecting a patterned beam of radiation through the liquid onto the substrate when the substrate is used as a confining surface for the liquid supplied by the liquid supply system,
wherein, at a point in time, (i) no portion of the closing surface comes in contact with the liquid supply system, (ii) the closing surface is held only by the liquid supply system, and (iii) liquid flows within the gap.

12. The method according to claim 11, wherein creating and maintaining the gap comprises creating an equilibrium state between forces exerted by a fluid flow and a low pressure.

13. The method according to claim 11, wherein the closing surface is formed on a closing plate, and wherein creating and maintaining the gap comprises gripping the closing plate on a face facing other than towards the liquid in the liquid supply system.

14. The method according to claim 13, wherein gripper is attached to the liquid supply system.

15. method according to claim 11, wherein creating and maintaining the gap comprises displacing the closing surface from the substrate table using a pin.

16. method according to claim 11, wherein creating and maintaining the gap comprises magnetically maintaining the gap using a magnet provided on each of the liquid supply system and the closing surface.

17. method according to claim 16, wherein maintaining the gap using a magnet provided on each of the liquid supply system and the closing surface comprising maintaining the gap using a magnet on each of the liquid supply system and the closing surface having opposing poles balanced against a magnet on each of the liquid supply system and the closing surface having the same poles.

18. method according to claim 11, wherein creating and maintaining the gap comprises magnetically maintaining the gap using a magnet provided on each of the liquid supply system and the substrate table.

19. The method according to claim 11, wherein the liquid that flows within the gap circulates.

20. The method according to claim 11, wherein the liquid that flows within the gap flows to an outlet.

* * * * *

UNITED STATES PATENT AND TRADEMARK OFFICE
CERTIFICATE OF CORRECTION

PATENT NO. : 7,403,261 B2  Page 1 of 1
APPLICATION NO. : 11/012061
DATED : July 22, 2008
INVENTOR(S) : Hans Jansen et al.

It is certified that error appears in the above-identified patent and that said Letters Patent is hereby corrected as shown below:

Col. 10, line 33
  replace "15. method according to claim 11, wherein creating and"
  with --15. The method according to claim 11, wherein creating and--.
Col. 10, line 36
  replace "16. method according to claim 11, wherein creating and"
  with --16. The method according to claim 11, wherein creating and--.
Col. 10, line 40
  replace "17. method according to claim 16, wherein maintaining the"
  with --17. The method according to claim 16, wherein maintaining the--.
Col. 10, line 47
  replace "18. method according to claim 11, wherein creating and"
  with --18. The method according to claim 11, wherein creating and--.

Signed and Sealed this

Twenty-seventh Day of October, 2009

David J. Kappos
*Director of the United States Patent and Trademark Office*